(12) United States Patent
Liu

(10) Patent No.: US 12,489,442 B2
(45) Date of Patent: Dec. 2, 2025

(54) ADJUSTABLE CAPACITOR DEVICE AND METHOD FOR ADJUSTING CAPACITANCE VALUE

(71) Applicant: UNITED MICROELECTRONICS CORP., Hsinchu (TW)

(72) Inventor: Shih-Yuan Liu, Kaohsiung (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 147 days.

(21) Appl. No.: 18/088,811

(22) Filed: Dec. 27, 2022

(65) Prior Publication Data

US 2024/0171173 A1 May 23, 2024

(30) Foreign Application Priority Data

Nov. 21, 2022 (TW) .................................. 111144399

(51) Int. Cl.
| | |
|---|---|
| *H03K 17/687* | (2006.01) |
| *H03K 5/24* | (2006.01) |
| *H10N 50/80* | (2023.01) |
| *H10N 70/20* | (2023.01) |

(52) U.S. Cl.
CPC ........... *H03K 17/6871* (2013.01); *H03K 5/24* (2013.01); *H10N 50/80* (2023.02); *H10N 70/24* (2023.02)

(58) Field of Classification Search
CPC ...... H03K 17/6871; H03K 5/24; H10N 50/80; H10N 70/24; H10N 50/10; H10N 70/20; H10N 70/826; H10N 70/8833
See application file for complete search history.

(56) References Cited

U.S. PATENT DOCUMENTS

| | | | | | |
|---|---|---|---|---|---|
| 5,319,345 | A | * | 6/1994 | Abe ..................... | H01C 10/50 338/48 |
| 6,013,958 | A | * | 1/2000 | Aytur ..................... | H03J 3/185 326/26 |
| 2005/0151575 | A1 | * | 7/2005 | Sibrai ................ | H03H 11/1291 327/334 |
| 2010/0067279 | A1 | * | 3/2010 | Choi .................. | G11C 13/0004 365/51 |
| 2010/0127787 | A1 | * | 5/2010 | Kurogo .................. | H03B 5/04 331/158 |
| 2013/0076550 | A1 | * | 3/2013 | Marukame ............. | H10B 61/00 341/158 |
| 2013/0076551 | A1 | * | 3/2013 | Marukame .......... | H03F 3/45183 341/159 |
| 2013/0241033 | A1 | * | 9/2013 | Murakami ........... | G11C 19/184 257/532 |
| 2014/0049119 | A1 | * | 2/2014 | Lee ........................ | H03K 17/56 307/109 |
| 2016/0112057 | A1 | * | 4/2016 | Park ..................... | H03M 1/506 341/172 |
| 2019/0310140 | A1 | * | 10/2019 | Mori ....................... | G01K 7/01 |

* cited by examiner

*Primary Examiner* — Timothy J. Dole
*Assistant Examiner* — Daniel M Dubuisson
(74) *Attorney, Agent, or Firm* — WPAT, PC

(57) ABSTRACT

An adjustable capacitor device and a method for adjusting a capacitance value are provided. The adjustable capacitor device includes a first variable resistor, a first comparator coupled between the first variable resistor and a first node, a first capacitor, a second capacitor, a first transistor coupled between the first node, the first capacitor and the second capacitor, and a second transistor coupled between the first node, the first capacitor and the second capacitor.

10 Claims, 2 Drawing Sheets

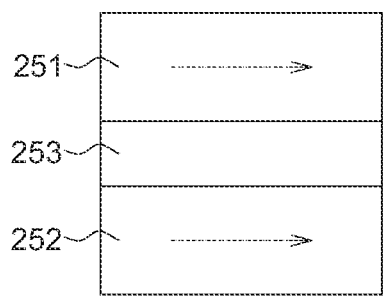 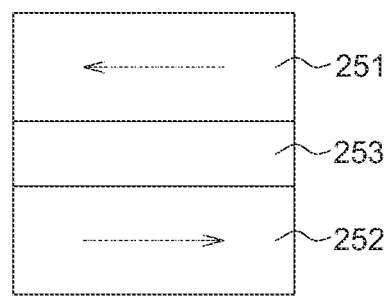
FIG. 2A  FIG. 2B
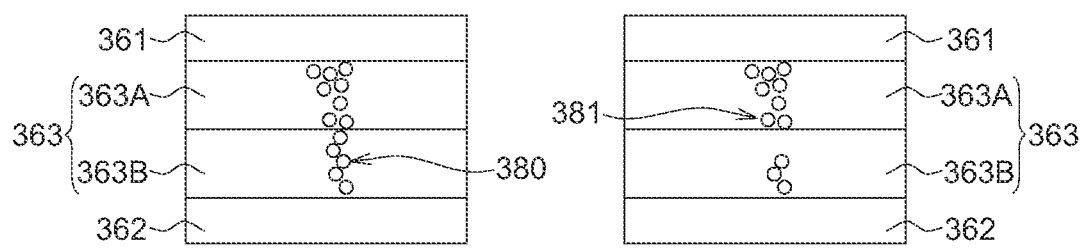
FIG. 3A  FIG. 3B

ADJUSTABLE CAPACITOR DEVICE AND METHOD FOR ADJUSTING CAPACITANCE VALUE This application claims the benefit of Taiwan application Serial No. 111144399, filed Nov. 21, 2022, the subject matter of which is incorporated herein by reference.

BACKGROUND

Technical Field

The disclosure relates to an adjustable capacitor device and a method for adjusting capacitance values, and more particularly to an adjustable capacitor device including a resistor and a method of using a resistor to adjust capacitance values.

Description of the Related Art

Capacitor device is one of the important electronic components in the semiconductor field. The capacitance value of a capacitor device affects the electrical performance of a semiconductor structure including the capacitive device. However, as semiconductor structures and semiconductor manufacturing processes become smaller, it is difficult to precisely control the capacitance value of the capacitor device.

It is desired to provide a capacitor device that can flexibly adjust the capacitance value thereof.

SUMMARY

According to an embodiment of the present disclosure, an adjustable capacitor device is provided. The adjustable capacitor device includes a first variable resistor, a first comparator coupled between the first variable resistor and a first node, a first capacitor, a second capacitor, a first transistor coupled between the first node, the first capacitor and the second capacitor, and a second transistor coupled between the first node, the first capacitor and the second capacitor.

According to another embodiment of the present disclosure, a method for adjusting capacitance values is provided. The method includes: using a first comparator to compare a first voltage of a first variable resistor with a reference voltage across a reference resistor and producing a first signal based on the comparison, wherein the first variable resistor is coupled to a first input terminal of the first comparator, the reference resistor has a reference resistance value and is coupled to a second input terminal of the first comparator; providing the first signal from a first output terminal of the first comparator to a first transistor coupled between a first capacitor and a second capacitor and a second transistor coupled between the first capacitor and the second capacitor; placing the first transistor and the second transistor in an ON state or an OFF state based on the first signal.

The above and other embodiments of the disclosure will become better understood with regard to the following detailed description of the non-limiting embodiment(s). The following description is made with reference to the accompanying drawings.

BRIEF DESCRIPTION OF THE DRAWINGS

FIG. 2A illustrates a schematic view of a variable resistor according to an embodiment of the present disclosure.

FIG. 2B illustrates a schematic view of a variable resistor according to an embodiment of the present disclosure.

FIG. 3A illustrates a schematic view of a variable resistor according to another embodiment of the present disclosure.

FIG. 3B illustrates a schematic view of a variable resistor according to another embodiment of the present disclosure.

DETAILED DESCRIPTION

Figure 1:
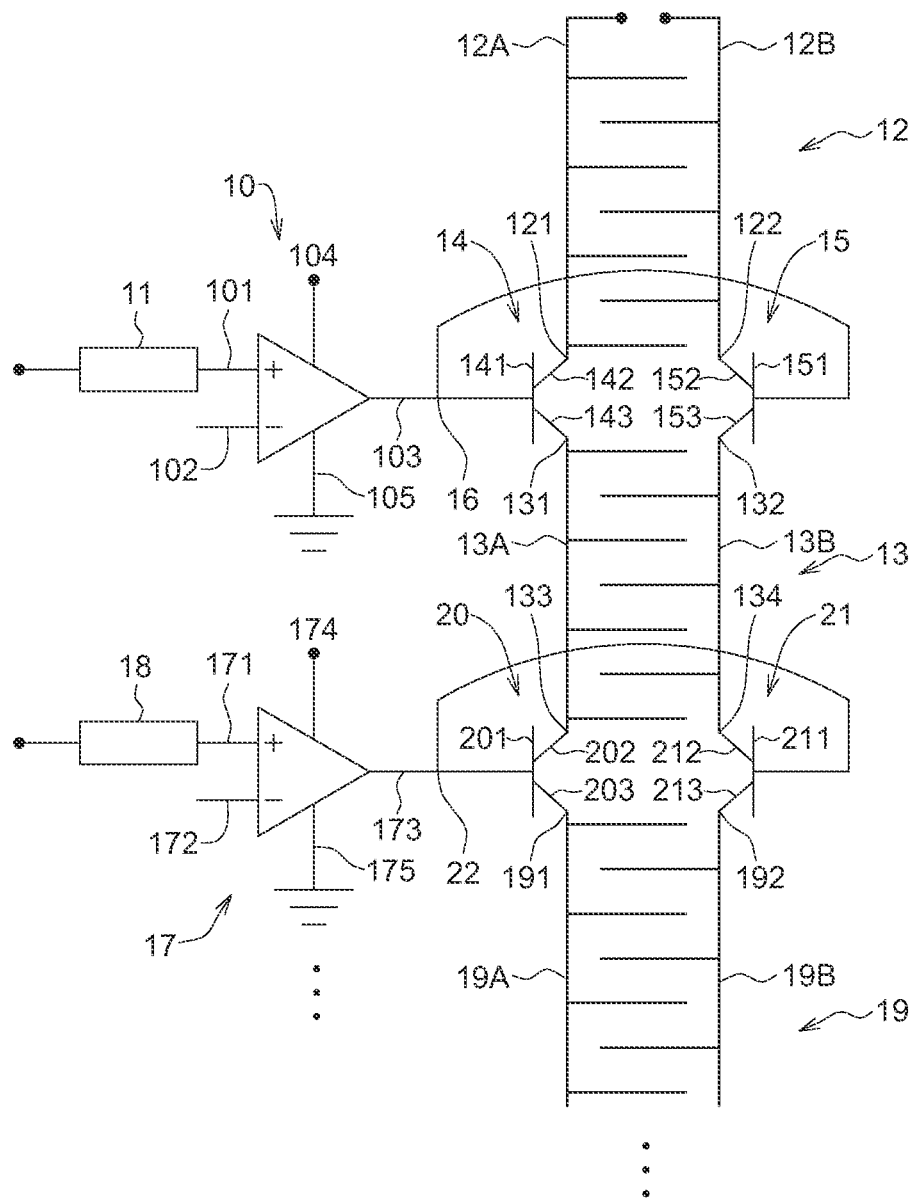
FIG. 1 illustrates a schematic view of an adjustable capacitor device according to an embodiment of the present disclosure.

The illustrations may not be necessarily drawn to scale, and there may be other embodiments of the present disclosure which are not specifically illustrated. Thus, the specification and the drawings are to be regard as an illustrative sense rather than a restrictive sense. Moreover, the descriptions disclosed in the embodiments of the disclosure such as detailed construction, manufacturing steps and material selections are for illustration only, not for limiting the scope of protection of the disclosure. The steps and elements in details of the embodiments could be modified or changed according to the actual needs of the practical applications. The disclosure is not limited to the descriptions of the embodiments. The illustration uses the same/similar symbols to indicate the same/similar elements.

Moreover, use of ordinal terms such as "first", "second", "third", etc., in the specification and claims to modify an element or a step does not by itself connote any priority, precedence, or order of one claim element or step over another, but are used merely as labels to distinguish one claim element or step having a certain name from another element or step having the same name (but for use of the ordinal term) to distinguish the claim elements or steps.

FIG. 1 illustrates a schematic view of an adjustable capacitor device 1 according to an embodiment of the present disclosure. The adjustable capacitor device 1 includes a comparator 10, a variable resistor 11, a capacitor 12, a capacitor 13, a transistor 14 and a transistor 15. The comparator 10 is coupled between the variable resistor 11 and a node 16. The comparator 10 includes an input terminal 101, an input terminal 102, an output terminal 103, a power supply terminal 104 and a power supply terminal 105. The input terminal 101 of the comparator 10 is coupled to the variable resistor 11. The input terminal 102 of the comparator 10 is coupled to a reference resistor having a reference resistance value. For example, the input terminal 101 can be a positive input terminal, and the input terminal 102 can be a negative input terminal. The output terminal 103 of the comparator 10 is coupled to the node 16. The power supply terminal 104 of the comparator 10 may be coupled to a voltage Vcc. The power supply terminal 105 of the comparator 10 may be grounded. The resistance value of the variable resistor 11 is variable. For example, the variable resistor 11 is switchable between a high resistance value and a low resistance value, and the reference resistance value coupled to the input terminal 102 of the comparator 10 is between the high resistance value and the low resistance value of the variable resistor 11.

FIGS. 2A-3B illustrates two types of variable resistors that can be used in the present disclosure. As shown in FIGS. 2A-2B, the variable resistor includes a first magnetic layer 251, a second magnetic layer 252, and an insulating layer 253 between the first magnetic layer 251 and the second magnetic layer 252. A relative direction of magnetization of the first magnetic layer 251 and the second magnetic layer 252 (a possible type of the direction of magnetization is indicated by dotted arrows in FIGS. 2A-2B) can be changed by applying proper operating voltages to the first magnetic layer 251 and the second magnetic layer 252, so that the variable resistor can be switched between a low resistance value (as shown in FIG. 2A) and a high resistance value (as shown in FIG. 2B). The first magnetic layer 251 and the second magnetic layer 252 may include metals such as nickel (Ni), iron (Fe), cobalt (Co), any combination thereof or other suitable materials. The insulating layer 253 may include oxide such as metal oxide. For example, the insulating layer 253 may include magnesium oxide (MgO) or other suitable materials. In other embodiments, as shown in FIGS. 3A-3B, the variable resistor includes an upper electrode 361, a lower electrode 362 and an oxide layer 363 between the upper electrode 361 and the lower electrode 362. The oxide layer 363 may include a multilayer structure. For example, the oxide layer 363 may include a first oxide film 363A and a second oxide film 363B. A conductive filament 380 can be induced in the first oxide film 363A and the second oxide film 363B by applying a proper operating voltage to the upper electrode 361 and the lower electrode 362. As shown in FIG. 3A, the conductive filament 380 penetrates the first oxide film 363A and the second oxide film 363B. The opposite ends of the conductive filament 380 contact the upper electrode 361 and the lower electrode 362 respectively, and can be used as a conductive path between the upper electrode 361 and the lower electrode 362. When the conductive filament 380 is formed, the variable resistor has a low resistance value. Then, another operating voltage can be applied to the upper electrode 361 and the lower electrode 362 to break the conductive filament 380 of FIG. 3A and form a broken conductive filament 381 shown in FIG. 3B; the variable resistor is switched from the low resistance value to a high resistance value at this time. The variable resistor can be switched between a low resistance value (as shown in FIG. 3A) and a high resistance value (as shown in FIG. 3B) by changing the operating voltage applied to the upper electrode 361 and the lower electrode 362. The upper electrode 361 and the lower electrode 362 may include conductive materials such as aluminum (Al), copper (Cu) or tungsten (W) or other suitable materials. The oxide layer 363 may include metal oxide or other suitable materials. For example, the oxide layer 363 may include at least one of tantalum oxide ($TaO_x$, $Ta_2O_5$), hafnium oxide ($HfO_x$), tungsten oxide ($WO_x$), aluminum oxide ($AlO_x$), nickel oxide ($NiO_x$), titanium oxide ($TiO_x$), and zirconium oxide ($ZrO_x$). In an embodiment, the first oxide film 363A includes $Ta_2O_5$, and the second oxide film 363B includes $TaO_x$.

As shown in FIG. 1, the transistor 14 is coupled between the node 16, the capacitor 12 and the capacitor 13. The transistor 15 is coupled between the node 16, the capacitor 12 and the capacitor 13. In this embodiment, the capacitor 12 and the capacitor 13 may be metal-oxide-metal (MOM) capacitors. The capacitor 12 may include an interconnection structure 12A and an interconnection structure 12B. The interconnection structure 12A may include a plurality of finger portions extending toward the interconnection structure 12B. The interconnection structure 12B may include a plurality of finger portions extending toward the interconnection structure 12A. The finger portions of the interconnection structure 12A and the finger portions of the interconnection structure 12B may be arranged alternately. The interconnection structure 12A includes a connection terminal 121. The interconnection structure 12B includes a connection terminal 122. The capacitor 13 may include an interconnection structure 13A and an interconnection structure 13B. The interconnection structure 13A may include a plurality of finger portions extending toward the interconnection structure 13B. The interconnection structure 13B may include a plurality of finger portions extending toward the interconnection structure 13A. The finger portions of the interconnection structure 13A and the finger portions of the interconnection structure 13B may be arranged alternately. The interconnection structure 13A includes a connection terminal 131 and a connection terminal 133. The interconnection structure 13B includes a connection terminal 132 and a connection terminal 134. In an embodiment, the capacitance value of the capacitor 12 is greater than the capacitance value of the capacitor 13. The capacitor 12 and the capacitor 13 are connected in parallel.

The transistor 14 includes a gate 141, a drain/source 142 and a drain/source 143. The transistor 15 includes a gate 151, a drain/source 152 and a drain/source 153. The gate 141 of the transistor 14 and the gate 151 of the transistor 15 are coupled to the node 16. The drain/source 142 of the transistor 14 is coupled to the connection terminal 121 of the interconnection structure 12A of the capacitor 12. The drain/source 143 of the transistor 14 is coupled to the connection terminal 131 of the interconnection structure 13A of the capacitor 13. The drain/source 152 of the transistor 15 is coupled to the connection terminal 122 of the interconnection structure 12B of the capacitor 12. The drain/source 153 of the transistor 15 is coupled to the connection terminal 132 of the interconnection structure 13B of the capacitor 13. The transistor 14 may be a N-type metal-oxide-semiconductor field-effect transistor (NMOS) or a P-type metal-oxide-semiconductor field-effect transistor (PMOS). The transistor 15 may be a N-type metal-oxide-semiconductor field-effect transistor (NMOS) or a P-type metal-oxide-semiconductor field-effect transistor (PMOS).

In an embodiment, both of the transistors 14 and 15 are NMOS; the drain/source 142 of the transistor 14 is a drain, the drain/source 143 of the transistor 14 is a source; the drain/source 152 of the transistor 15 is a drain, the drain/source 153 of the transistor 15 is a source. In another embodiment, both of the transistors 14 and 15 are PMOS; the drain/source 142 of the transistor 14 is a source, the drain/source 143 of the transistor 14 is a drain; the drain/source 152 of the transistor 15 is a source, the drain/source 153 of the transistor 15 is a drain.

The adjustable capacitor device 1 includes at least two capacitors, so that the adjustable capacitance device 1 has at least two capacitance values. In an embodiment with two capacitors (e.g. the capacitors 12 and 13), the adjustable capacitor device 1 can have a capacitance value when the capacitors 12 and 13 are used at the same time, and can have a different capacitance value when the capacitor 13 is not used.

In an embodiment, the adjustable capacitor device 1 includes three or more capacitors. For example, as shown in FIG. 1, the adjustable capacitor device 1 may further includes a capacitor 19, a transistor 20, a transistor 21, a comparator 17 and a variable resistor 18 in addition to the comparator 10, the variable resistor 11, the capacitor 12, the capacitor 13, the transistor 14 and the transistor 15 described above.

The comparator 17 is coupled between the variable resistor 18 and a node 22. The comparator 17 includes an input terminal 171, an input terminal 172, an output terminal 173, a power supply terminal 174 and a power supply terminal 175. The input terminal 171 of the comparator 17 is coupled to the variable resistor 18. The input terminal 172 of the comparator 17 is coupled to a reference resistor having a reference resistance value. The reference resistor coupled to the input terminal 172 of the comparator 17 may be the same as or different from the reference resistor coupled to the input terminal 102 of the comparator 10. For example, the input terminal 171 can be a positive input terminal, and the input terminal 172 can be a negative input terminal. The output terminal 173 of the comparator 17 is coupled to the node 22. The power supply terminal 174 of the comparator 17 may be coupled to a voltage Vcc. The power supply terminal 175 of the comparator 17 may be grounded. The resistance value of the variable resistor 18 is variable. For example, the variable resistor 18 is switchable between a high resistance value and a low resistance value, and the reference resistance value coupled to the input terminal 172 of the comparator 17 is between the high resistance value and the low resistance value of the variable resistor 18. In an embodiment, the variable resistor shown in FIGS. 2A-2B or the variable resistor shown in FIGS. 3A-3B can be used as the variable resistor 18.

The transistor 20 is coupled between the node 22, the capacitor 13 and the capacitor 19. The transistor 21 is coupled between the node 22, the capacitor 13 and the capacitor 19. In this embodiment, the capacitor 19 may be a metal-oxide-metal (MOM) capacitor. The capacitor 19 may include an interconnection structure 19A and an interconnection structure 19B. The interconnection structure 19A may include a plurality of finger portions extending toward the interconnection structure 19B. The interconnection structure 19B may include a plurality of finger portions extending toward the interconnection structure 19A. The finger portions of the interconnection structure 19A and the finger portions of the interconnection structure 19B may be arranged alternately. The interconnection structure 19A includes a connection terminal 191. The interconnection structure 19B includes a connection terminal 192. In an embodiment, the capacitance value of the capacitor 12 is greater than the capacitance value of the capacitor 19. In this embodiment, the capacitors 12, 13 and 19 are connected in parallel.

The transistor 20 includes a gate 201, a drain/source 202 and a drain/source 203. The transistor 21 includes a gate 211, a drain/source 212 and a drain/source 213. The gate 201 of the transistor 20 and the gate 211 of the transistor 211 are coupled to the node 22. The drain/source 202 of the transistor 20 is coupled to the connection terminal 133 of the interconnection structure 13A of the capacitor 13. The drain/source 203 of the transistor 20 is coupled to the connection terminal 191 of the interconnection structure 19A of the capacitor 19. The drain/source 212 of the transistor 21 is coupled to the connection terminal 134 of the interconnection structure 13B of the capacitor 13. The drain/source 213 of the transistor 21 is coupled to the connection terminal 192 of the interconnection structure 19B of the capacitor 19. The transistor 20 may be a NMOS or a PMOS. The transistor 21 may be a NMOS or a PMOS. In the case of the adjustable capacitor device including three capacitors (e.g. the capacitors 12, 13 and 19), the adjustable capacitor device 1 can have a first capacitance value when the capacitor 12, the capacitor 13 and the capacitor 19 are used at the same time, and have a second capacitance value when the capacitor 12 and the capacitor 13 are used without using the capacitor 19, and have a third capacitance value when the capacitor 12 is used without using the capacitor 13 and the capacitor 19. The first capacitance value, the second capacitance value and the third capacitance value are different from each other. The number of capacitors in the adjustable capacitor device of the present disclosure is not limited to the number of capacitors shown in FIG. 1, more or fewer capacitors, more or fewer comparators, more or fewer variable resistors, and more or fewer transistors can be disposed in the adjustable capacitor device of the present disclosure by analogy with the above description.

A method for adjusting capacitance values according to an embodiment of the present disclosure will be described below with reference to FIG. 1. The method includes the following steps:

An operating voltage is applied to the variable resistor 11 to change a resistance value of the variable resistor 11, so that the variable resistor 11 has one of the high resistance value and the low resistance value. Applying an operating voltage to the variable resistor 18 to change a resistance value of the variable resistor 18, so that the variable resistor 18 has one of the high resistance value and the low resistance value. For example, if the variable resistor 11 is the variable resistor including the first magnetic layer 251, the second magnetic layer 252, and the insulating layer 253 between the first magnetic layer 251 and the second magnetic layer 252 shown in FIGS. 2A-2B, applying an operating voltage to the variable resistor 11 can change a relative direction of magnetization of the first magnetic layer 251 and the second magnetic layer 251, and change the resistance value of the variable resistor 11. For example, if the variable resistor 11 is the variable resistor including the upper electrode 361, the lower electrode 362 and the oxide layer 363 between the upper electrode 361 and the lower electrode 362 shown in FIGS. 3A-3B, applying an operating voltage to the variable resistor 11 can induce the conductive filament 380 in the oxide layer 363, and change the resistance value of the variable resistor 11. The variable resistor 11 may be the same as or different from the variable resistor 18.

The comparator 10 is used to compare a first voltage produced by the variable resistor 11 with a reference voltage across the reference resistor coupled to the input terminal 102 of the comparator 10, and the comparator 10 produces a first signal based on the comparison. The first signal is provided from the output terminal 103 of the comparator 10 to the transistors 14 and 15 coupled between the capacitors 12 and 13. The transistors 14 and 15 are placed in an ON state or an OFF state based on the first signal. When the variable resistor 11 has the high resistance value, the resistance value of the variable resistor 11 is greater than the reference resistance value coupled to the comparator 10, and the first signal produced by the comparator 10 is at a low voltage level. When the variable resistor 11 has the low resistance value, the resistance value of the variable resistor 11 is less than the reference resistance value coupled to the comparator 10, and the first signal produced by the comparator 10 is at a high voltage level. In an embodiment, both of the transistors 14 and 15 are NMOS; the first signal at a high voltage level causes transistor 14 and 15 to be placed in an ON state, and the capacitors 12 and 13 are connected in parallel; the first signal at a low voltage level causes transistor 14 and 15 to be placed in an OFF state, and the capacitors 12 and 13 are disconnected. In another embodiment, both of the transistors 14 and 15 are PMOS; the first signal at a high voltage level causes transistor 14 and 15 to be placed in an OFF state, and the capacitors 12 and 13 are disconnected; the first signal at a low voltage level causes transistor 14 and 15 to be placed in an ON state, and the capacitors 12 and 13 are connected in parallel.

The comparator 17 is used to compare a second voltage produced by the variable resistor 18 with a reference voltage across the reference resistor coupled to the input terminal 172 of the comparator 17, and the comparator 17 produces a second signal based on the comparison. The second signal is provided from the output terminal 173 of the comparator 17 to the transistors 20 and 21 coupled between the capacitors 13 and 19. The transistors 20 and 21 are placed in an ON state or an OFF state based on the second signal. When the variable resistor 18 has the high resistance value, the resistance value of the variable resistor 18 is greater than the reference resistance value coupled to the comparator 17, and the second signal produced by the comparator 17 is at a low voltage level. When the variable resistor 18 has the low resistance value, the resistance value of the variable resistor 18 is less than the reference resistance value coupled to the comparator 17, and the second signal produced by the comparator 17 is at a high voltage level. In an embodiment, both of the transistors 20 and 21 are NMOS; the second signal at a high voltage level causes transistor 20 and 21 to be placed in an ON state, and the capacitors 13 and 19 are connected in parallel; the second signal at a low voltage level causes transistor 20 and 21 be placed in an OFF state, and the capacitors 13 and 19 are disconnected. In another embodiment, both of the transistors 20 and 21 are PMOS; the second signal at a high voltage level causes transistor 20 and 21 to be placed in an OFF state, and the capacitors 13 and 19 are disconnected; the second signal at a low voltage level causes transistor 20 and 21 to be placed in an ON state, and the capacitors 13 and 19 are connected in parallel.

In an embodiment in which the adjustable capacitor device does not include the capacitor 19, the method for adjusting capacitance values may not include the above steps related to the capacitor 19, the comparator 17 and the variable resistor 18.

The adjustable capacitor device and the method for adjusting capacitance values according to the present disclosure are directed to the arrangement of variable resistor(s), comparator(s) and transistor(s) and control of connection or disconnection between capacitors through changing the operating voltage applied to the variable resistor.

The present disclosure is directed to the adjustable capacitor device and the method for adjusting capacitance values relate to variable resistor. With the arrangement of variable resistor(s), comparator(s) and transistor(s), connection or disconnection between capacitors can be controlled through changing the operating voltage applied to the variable resistor, and the capacitance value of the device can be easily adjusted to the required value. As such, a flexible adjustment of the capacitance value of the device can be achieved. The capacitance value of the existing capacitor device is usually determined at the time of production, and the problem that the capacitance value of the manufactured capacitor device deviates from the original design value often occurs. As compared with the existing capacitor device, the adjustable capacitor device and the method for adjusting capacitance values according to the present disclosure can solve the deviation problem in the production, increase the process window and simplify the process steps. In addition, the adjustable capacitor device and the method for adjusting capacitance values according to the present disclosure can be adjusted to different capacitance values several times in response to different needs since the variable resistor can be repeatedly switched between different resistance values. The adjustable capacitor device according to the present disclosure has wide applications. The present disclosure can be applied to the MOM capacitor to improve the problem of inaccurate capacitance value of the MOM capacitor, which can widen the application of the MOM capacitor.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An adjustable capacitor device, comprising:
    a first variable resistor;
    a first comparator coupled between the first variable resistor and a first node;
    a first capacitor;
    a second capacitor;
    a first transistor coupled between the first node, the first capacitor and the second capacitor;
    a second transistor coupled between the first node, the first capacitor and the second capacitor;
    a second comparator comprises a first input terminal, a second input terminal and a first output terminal, the second input terminal is coupled to a reference resistor having a reference resistance value, the first output terminal is coupled to a second node;
    a second variable resistor coupled to the first input terminal of the second comparator;
    a third capacitor;
    a third transistor coupled between the second node, the second capacitor and the third capacitor; and
    a fourth transistor coupled between the second node, the second capacitor and the third capacitor.

2. The adjustable capacitor device according to claim 1, wherein the first comparator comprises a third input terminal, a fourth input terminal and a second output terminal, the third input terminal is coupled to the first variable resistor, the fourth input terminal is coupled to a reference resistor, the second output terminal is coupled to the first node, the reference resistor has a reference resistance value.

3. The adjustable capacitor device according to claim 2, wherein the first variable resistor is switchable between a high resistance value and a low resistance value, the reference resistance value is between the high resistance value and the low resistance value.

4. The adjustable capacitor device according to claim 1, wherein a gate of the first transistor is coupled to the first node, a gate of the second transistor is coupled to the first node.

5. The adjustable capacitor device according to claim 1, wherein the first capacitor comprises a first connection terminal and a second connection terminal, the second capacitor comprises a third connection terminal and a fourth connection terminal, a drain of the first transistor is coupled to the first connection terminal of the first capacitor, a source of the first transistor is coupled to the third connection terminal of the second capacitor, a drain of the second transistor is coupled to the second connection terminal of the first capacitor, and a source of the second transistor is coupled to the fourth connection terminal of the second capacitor.

6. The adjustable capacitor device according to claim 1, wherein the first capacitor has a first capacitance value, the second capacitor has a second capacitance value, the first capacitance value is greater than the second capacitance value.

7. The adjustable capacitor device according to claim 1, wherein the first variable resistor comprises an upper electrode, a lower electrode and an oxide layer between the upper electrode and the lower electrode.

8. The adjustable capacitor device according to claim 1, wherein the first variable resistor comprises a first magnetic layer, a second magnetic layer, and an insulating layer between the first magnetic layer and the second magnetic layer.

9. The adjustable capacitor device according to claim 1, wherein the first capacitor and the second capacitor are metal-oxide-metal (MOM) capacitors.

10. The adjustable capacitor device according to claim 1, wherein a gate of the third transistor is coupled to the second node, a gate of the fourth transistor is coupled to the second node.

\* \* \* \* \*